United States Patent
Iwamoto

(10) Patent No.: US 6,469,773 B1
(45) Date of Patent: *Oct. 22, 2002

(54) STAGE APPARATUS, EXPOSURE APPARATUS AND DEVICE MANUFACTURING METHOD

(75) Inventor: Kazunori Iwamoto, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/205,171

(22) Filed: Dec. 4, 1998

(30) Foreign Application Priority Data

Dec. 10, 1997 (JP) .............................. 9-340052
Oct. 12, 1998 (JP) ........................... 10-289383

(51) Int. Cl.$^7$ ........................... G03B 27/42; G03B 27/58
(52) U.S. Cl. ........................... 355/53; 355/72
(58) Field of Search ............................... 355/53, 72, 75; 318/687, 560, 671, 640, 35, 568.17, 592, 611, 623

(56) References Cited

U.S. PATENT DOCUMENTS

| | | | | |
|---|---|---|---|---|
| 3,576,133 A | * | 4/1971 | Krupick ............................ | 74/5 |
| 4,648,725 A | | 3/1987 | Takahashi ....................... | 384/9 |
| 4,676,649 A | | 6/1987 | Phillips ........................ | 356/401 |
| 5,022,619 A | | 6/1991 | Mamada ...................... | 248/178 |
| 5,040,431 A | | 8/1991 | Sakino et al. .................. | 74/479 |
| 5,194,893 A | | 3/1993 | Nishi ........................... | 355/53 |
| 5,281,996 A | | 1/1994 | Bruning et al. ................ | 355/77 |
| 5,467,720 A | | 11/1995 | Korenaga et al. .............. | 108/20 |
| 5,504,407 A | * | 4/1996 | Wakui et al. ........... | 318/568.17 |
| 5,608,773 A | | 3/1997 | Korenaga et al. .............. | 378/34 |
| 5,610,686 A | | 3/1997 | Osanai ......................... | 355/72 |
| 5,623,853 A | | 4/1997 | Novak et al. ............. | 74/490.09 |
| 5,681,638 A | | 10/1997 | Korenaga ................... | 428/119 |
| 5,684,856 A | | 11/1997 | Itoh et al. ..................... | 378/34 |
| 5,699,145 A | | 12/1997 | Makinouchi et al. ........ | 250/548 |
| 5,781,277 A | | 7/1998 | Iwamoto ...................... | 355/53 |
| 5,796,467 A | | 8/1998 | Suzuki ......................... | 355/53 |
| 5,796,469 A | | 8/1998 | Ebinuma ...................... | 355/53 |
| 5,909,272 A | | 6/1999 | Osanai et al. ................. | 355/53 |
| 5,959,427 A | * | 9/1999 | Watson ........................ | 318/687 |
| 5,982,128 A | * | 11/1999 | Lee ........................ | 318/568.16 |

FOREIGN PATENT DOCUMENTS

| | | |
|---|---|---|
| EP | 0 393 994 | 10/1990 |
| EP | 0 502 578 | 9/1992 |
| EP | 0 557 100 | 8/1993 |
| JP | 3-21894 | 1/1991 |

OTHER PUBLICATIONS

*IBM Technical Disclosure Bulletin*, vol. 32, No. 5B, Oct. 1989, pp. 19–21.

* cited by examiner

Primary Examiner—Russell Adams
Assistant Examiner—Rodney Fuller
(74) Attorney, Agent, or Firm—Fitzpatrick, Cella, Harper & Scinto

(57) ABSTRACT

A stage apparatus includes a stage moving in a prescribed direction while holding a substrate and a mechanism for generating a force that changes in accordance with an acceleration when the stage moves, and for applying the force to the substrate from the direction of the acceleration so that a force applied between the stage and the substrate by the acceleration is canceled.

72 Claims, 11 Drawing Sheets

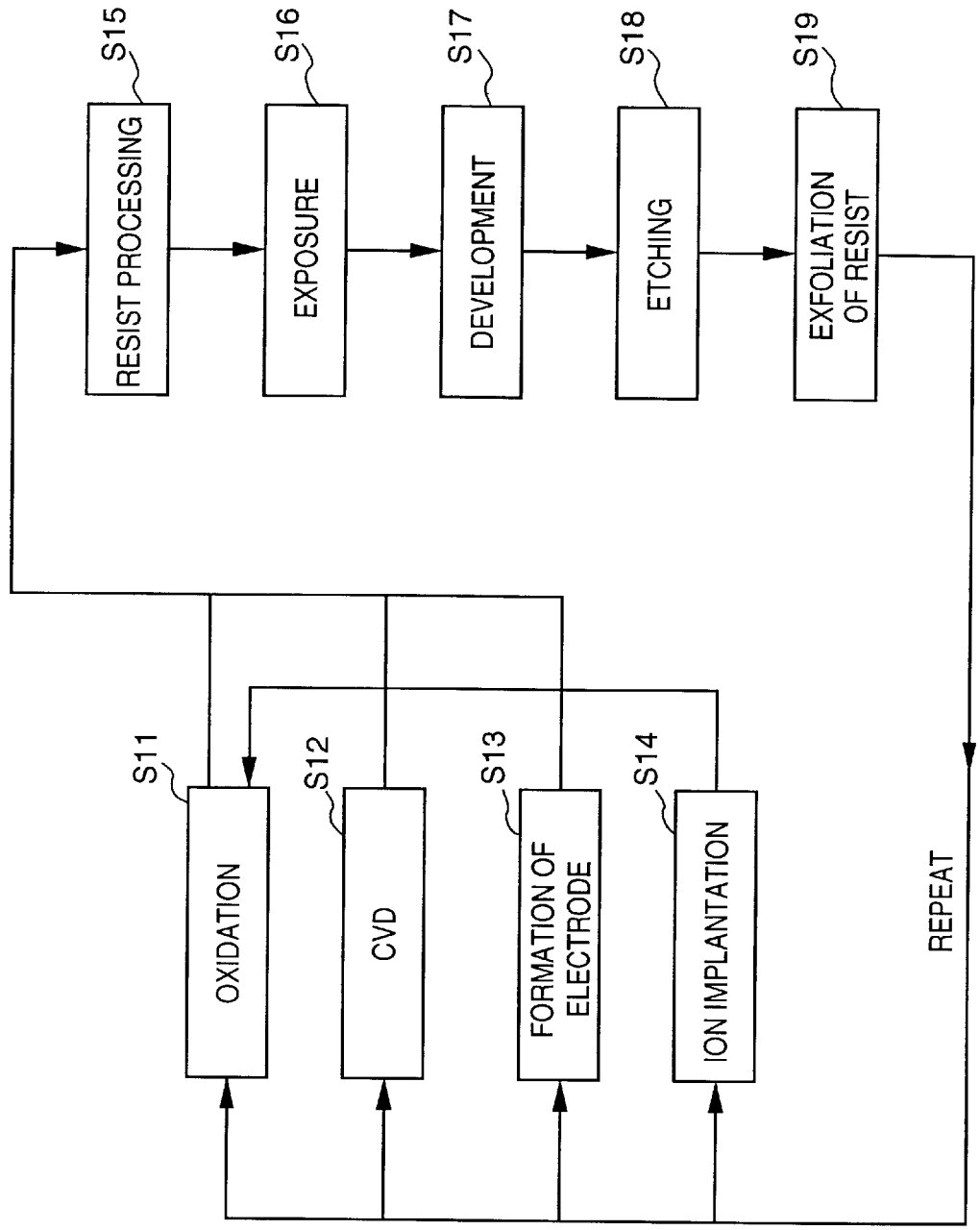

STAGE APPARATUS, EXPOSURE APPARATUS AND DEVICE MANUFACTURING METHOD

BACKGROUND OF THE INVENTION

The present invention relates to the technical field of a stage apparatus for transporting substrates such as reticles, wafers and the like and further a scanning exposure apparatus and a device manufacturing method using the stage apparatus.

An exposure apparatus for transferring the fine pattern of a reticle onto a wafer on which a light sensitive agent is coated is used in a photolithographic process when semiconductors are manufactured.

Recently, there is a request for increasing an exposing region as the size of semiconductors increases. To satisfy this request. a scanning exposure apparatus employing a so-called step and scan system is proceeding toward practical utilization. This type of the scanning exposure apparatus irradiates slit- or arc-shaped illumination light onto a reticle, exposes a wafer at the reducing magnification of a projecting optical system in the long distance direction of a slit and exposes the wafer at the reducing magnification ratio of the projecting optical system in the short distance direction thereof while synchronizing the reticle with the wafer.

In a step and scan sequence, the reticle and the wafer are repeatedly accelerated and decelerated because they stop and move for each exposing shot. Since a force corresponding to the acceleration caused at the time and to the mass of the substrate (reticle or wafer) is applied to the substrate, the substrate must be held on a stage by a holding force which endures the above force. Ordinarily, the substrate is adsorbed to and held on the stage with a vacuum adsorbing force.

In order to more improve the capability of a device (improvement of processing throughput and an increase of a substrate size) and to enhance productivity hereinafter, it is unavoidable that the mass of a substrate is increased by an increase of a stage acceleration and an increase of a substrate size. However, since a larger force is required to hold a substrate as they are more increased, it has become difficult to hold the substrate against the acceleration only with the vacuum adsorbing force.

SUMMARY OF THE INVENTION

An object of the present invention made to solve the above problem is to provide a stage apparatus having a holding mechanism capable of coping with a larger acceleration and holding a larger substrate and an exposure apparatus of high productivity and a device manufacturing method using the stage apparatus.

To solve the above problem, a stage apparatus of the present invention includes a stage moving in a prescribed direction while holding a substrate; and a mechanism for activating a force which changes in accordance with an acceleration when the substrate moves on the stage from the direction of the acceleration, wherein a force for canceling the force acting on the substrate as the stage is accelerated is applied on the substrate.

Further, a stage apparatus of the present invention includes a stage moving in a prescribed direction while holding a substrate; a counter mass movable in a direction in which the moving direction component of the stage is included; and a mechanism for applying the torque of the moment generated by the counter mass to the substrate.

It is preferable that the mechanism has a lever supported by a hinge mechanism, an end of the lever is connected to the counter mass, and the lever imposes a force on a side of the substrate through the other end thereof to thereby apply a force for canceling the force acting on the substrate as the stage is accelerated.

It is preferable that a dispersed force is applied to a side of the substrate from the other end of the lever through a uniform pressure member.

It is preferable that the stage is reciprocatingly movable along a prescribed direction and a plurality of sets of the mechanisms is disposed on both sides of the substrate with respect to the moving direction of the stage so that the mechanisms can apply a force to the substrate when the substrate moves both forward and backward. As an example, four sets of the mechanisms are disposed to thereby apply forces to the four corners of the substrate.

It is preferable that the substrate is held to the stage with a vacuum adsorbing force.

It is preferable that the stage apparatus includes a unit for applying a pre-load to both sides of the substrate with respect to the moving direction thereof not only when the substrate is accelerated but also when the substrate is not accelerated. As an example, the unit for applying the pre-load has a spring connected to the counter mass.

It is preferable that when the mass of the substrate is represented by M and the maximum acceleration of a moving body until the moving body is accelerated from a stationary state to a constant speed state or until the moving body is decelerated from the constant speed state to the stationary state is represented by A, the pre-load f satisfies the condition $|f| \geq |M \times A|$.

An exposure apparatus of the present invention includes an illuminating optical system for illuminating the prescribed illuminating region of a reticle, a projecting optical system for projecting the pattern in the illuminating region on the reticle onto a wafer by reducing the size of the pattern, a reticle stage movable in a prescribed direction with respect to the illuminating region and a wafer stage movable in a prescribed direction with respect to an exposing region which is conjugate with the illuminating region and performing scan exposure by moving the reticle stage and the wafer stage together with respect to the projecting optical system, wherein the stage apparatus discussed above is used as the reticle stage.

A device manufacturing method of the present invention includes manufacturing steps including a step for performing exposure using the above exposure apparatus.

Further objects and preferred aspects of the present invention will become apparent from the description of the following embodiments.

BRIEF DESCRIPTION OF THE DRAWINGS

FIG. 11 is a flowchart showing a wafer process in detail.

DESCRIPTION OF THE PREFERRED EMBODIMENT

First, to describe embodiments, a principle for canceling a force applied to a substrate in accordance with an acceleration and the mass of the substrate will be described with reference to FIG. 1.

Figure 1:
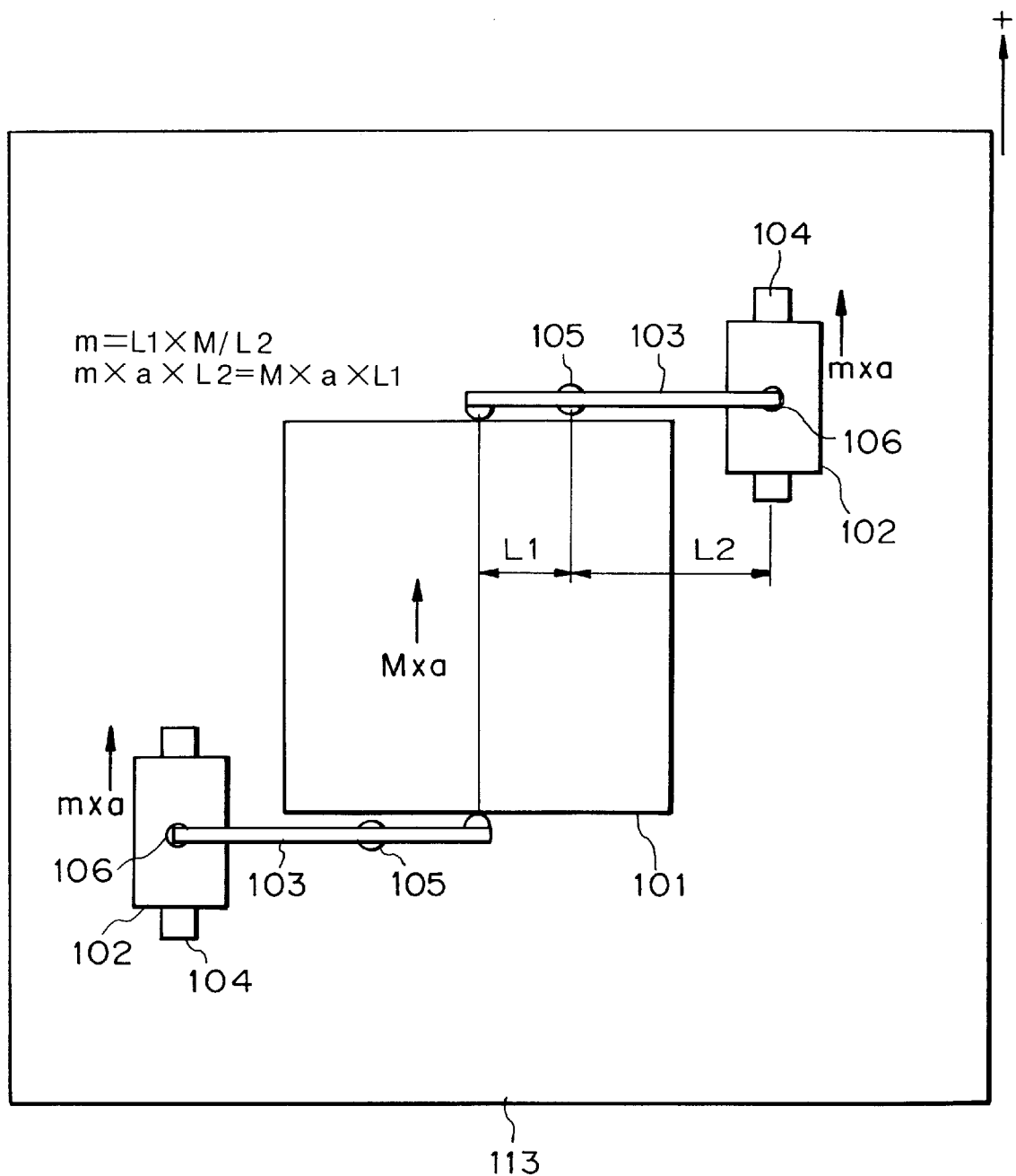
FIG. 1 is a view describing a principle for canceling a force applied to a substrate.

In FIG. 1, numeral 113 denotes a movable stage, numeral 101 denotes a substrate (reticle or wafer), numeral 102 denotes a counter mass, numeral 103 denotes a lever for transmitting a force, numeral 104 denotes a single-axis guide for movably guiding the counter mass 102 in the same direction as the movable stage 113, numeral 105 denotes a rotational hinge (fulcrum) fixed on the stage 113 and numeral 106 denotes a rotational hinge for coupling the counter mass 102 with the lever 103. Two sets of the same mechanisms arranged as described above are disposed on the stage 113 at the positions where the end surfaces of the substrate 101 confront each other so that forces act on the substrate 101 from two directions in confrontation with each other. Note, the mass of the substrate 101 is represented by M and the mass of the counter mass 102 is represented by m.

In the above arrangement, when the stage 113 is accelerated in a downward direction (hereinafter, referred to as a minus direction) in the figure by an acceleration a, an acceleration a is generated to the substrate 101 in an upward direction (hereinafter, referred to as a plus direction) in the figure with resect to the stage 113 so that a force +M×a is applied to the substrate 101. At the same time, an acceleration a is generated to the counter masses 102 in an upward direction (hereinafter, referred to as a plus direction) in the figure with resect to the stage 113 so that a force +m×a is applied thereto. The distance between the rotational hinge 105 and the rotational hinge 106 of the lever 103 is represented by L2 and the distance between the rotational hinge 105 and the point of application of the substrate 101 is represented by L1. At the time, when the above arrangement satisfies m=L1×M/L2, a torque having a moment of M×a× L1 is applied to the point of application of the substrate 101 in a clockwise direction about the rotational hinge 105, whereas a torque having a moment of m×a×L2=((L1×M/ L2)×a×L2)=M×a×L1 is applied to the rotational hinge 106 in a counterclockwise direction about the rotational hinge 105.

As a result, the force applied to the substrate 101 is always canceled regardless of the magnitude and change of the acceleration. In the two mechanisms arranged in confrontation with each other, since the force +m×a is applied to the counter masses 102 and the points of application of the levers 103 move in the direction where they are apart from the substrate 101, no force acts on the substrate 101.

That is, since the force applied between the stage 113 and the substrate 101 by the acceleration and deceleration of the stage 113 can be canceled regardless of the magnitude and change of the acceleration, the dislocation of the substrate 101 can be prevented when it is accelerated or decelerated.

Further, when an acceleration is applied to the stage 113 in an opposite direction, a force applied thereto also can be canceled by the occurrence of an action which is entirely opposite to the above description. Note, it is sufficient for practical use to cancel and reduce the force applied to the substrate 101 to such a degree as to permit a vacuum adsorbing force to hold the substrate against an acceleration even if a force for completely canceling the force applied to the substrate is not applied to the substrate by the counter masses.

Figure 2:
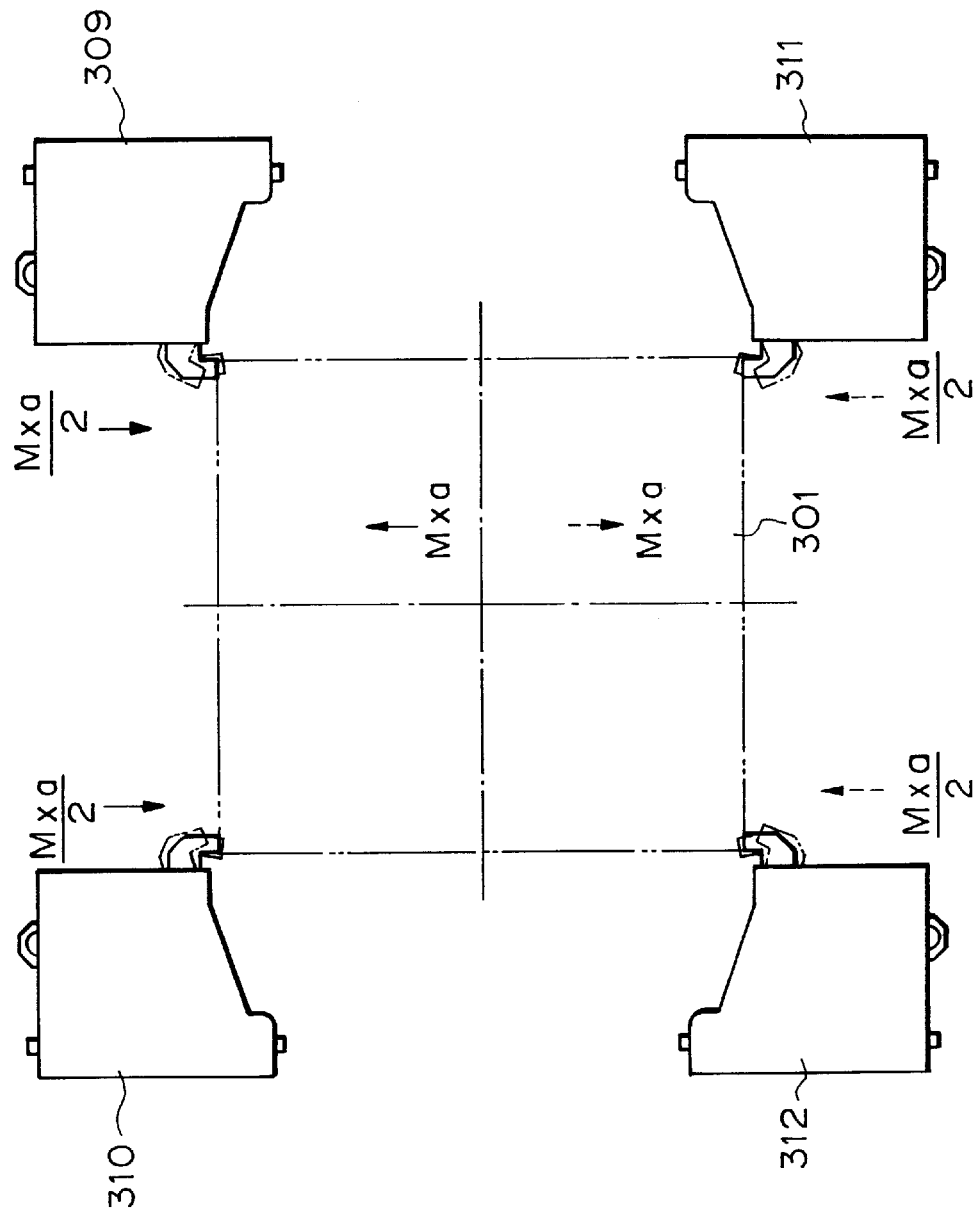
FIG. 2 is a view showing the arrangement of a first embodiment.

Next, a holding mechanism for holding the stage for realizing the above function will be more specifically described with reference to a reticle stage as an example. In FIG. 2, four units 309, 310, 311, 312 are arranged to press the four corners of a reticle 301 with levers. When the mass of the reticle 301 is represented by M, the units 309, 310 cancel M/2, respectively, and the units 311, 312 cancel M/2 in an opposite direction, respectively.

Figure 3:
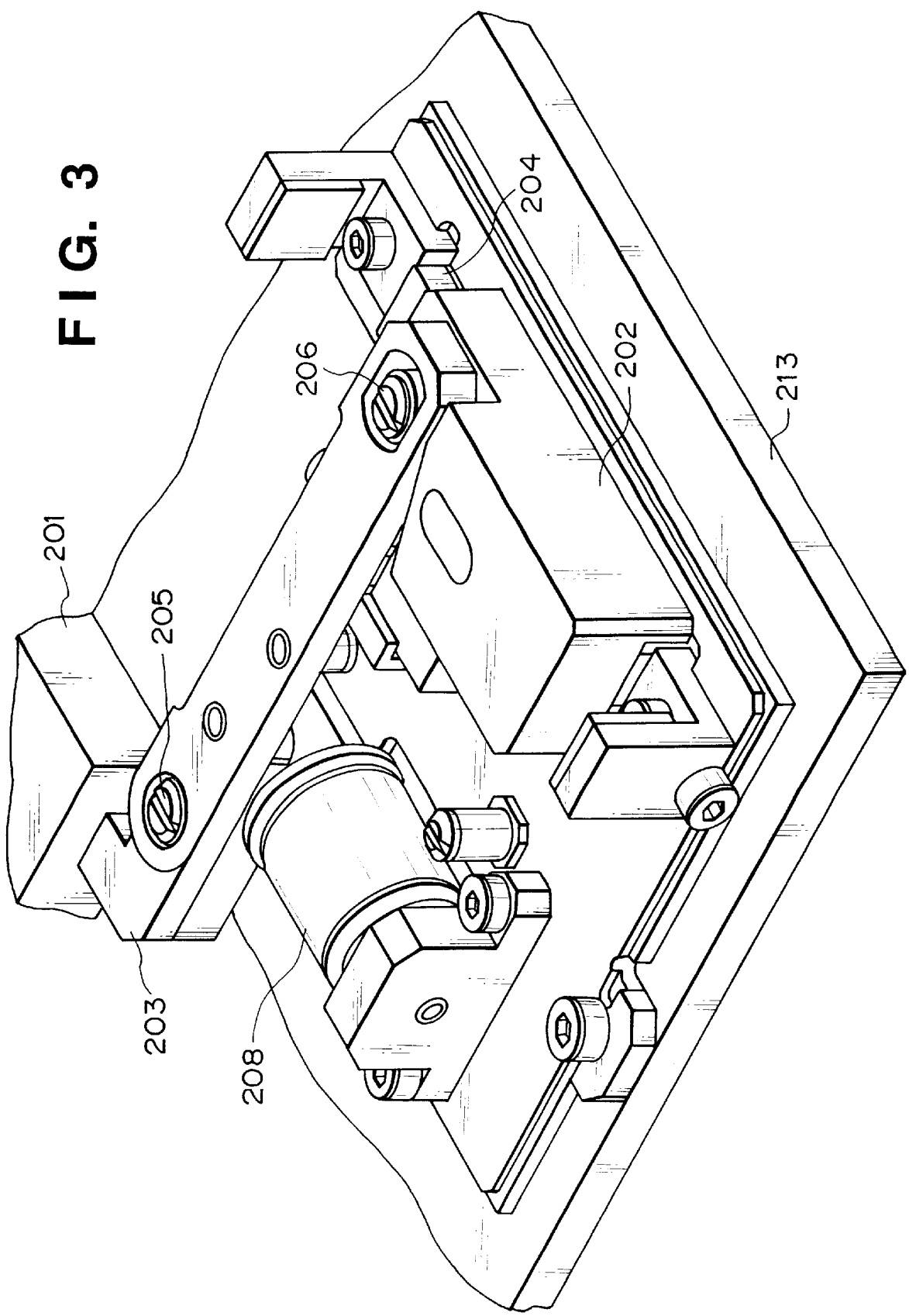
FIG. 3 is a perspective view showing a unit shown in FIG. 2 in detail.

Each of the units has the mechanism shown in FIG. 3. In FIG. 3, numeral 201 denotes a reticle and the unit is composed of a counter mass 202, a single-axis guide 204 for the counter mass 202, a lever 203 for transmitting a force, a rotational hinge 205 fixed on a stage 213, a rotational hinge 206 for coupling the counter mass 202 with the lever 203 and a retreating actuator 208 for retreating the lever 203 in alignment.

A force applied to the reticle 201 for cancellation acts in the same manner as described in FIG. 1. When the reticle 201 is transported on a reticle stage (not shown) from a reticle transporting system (not shown) for alignment, the retreating actuator 208 separates the point of application of the lever 203 from the reticle 201 so that no external force is applied to the reticle 201.

Figure 4:
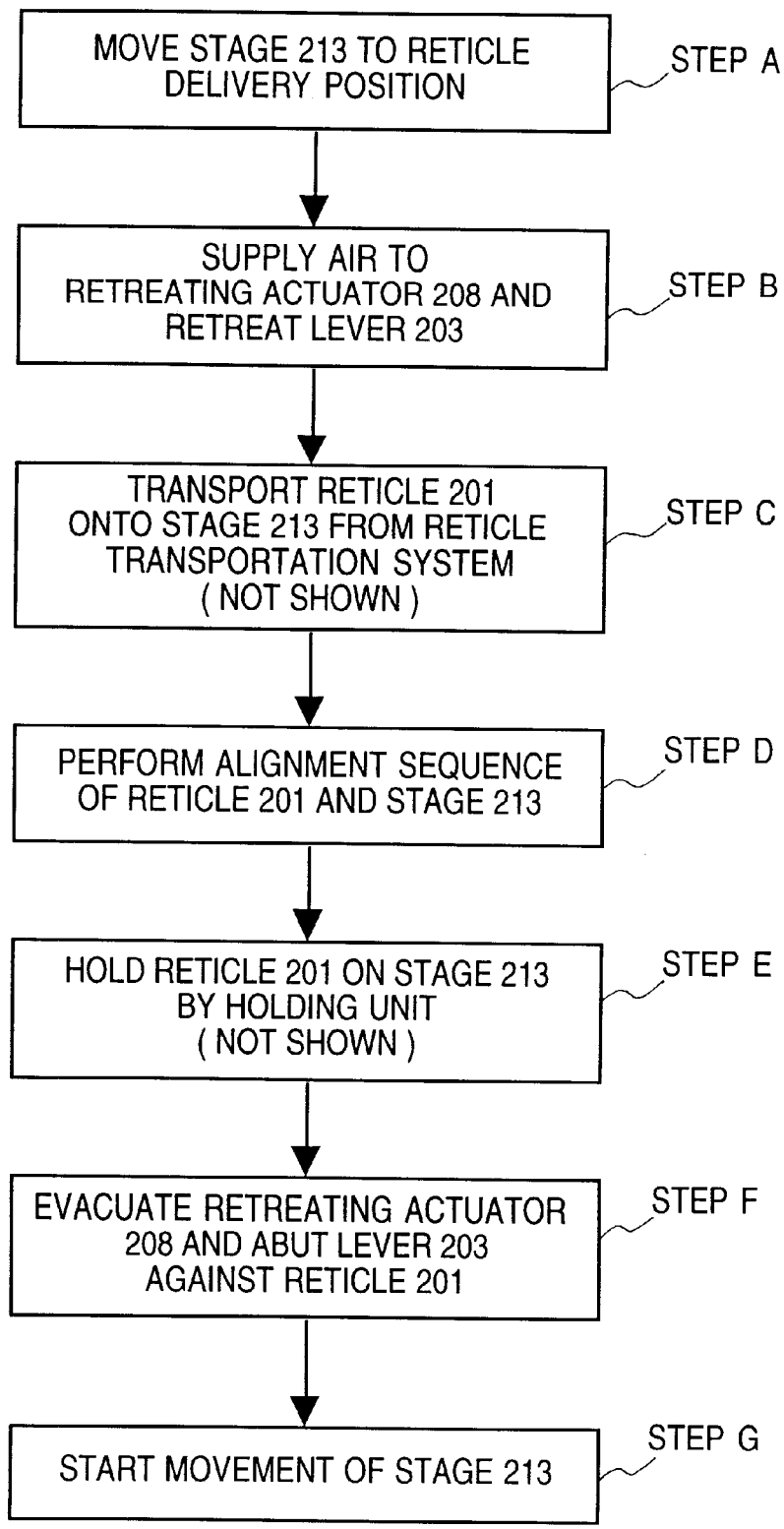
FIG. 4 is a flowchart showing a sequence for delivering a reticle.

FIG. 4 shows a sequence for delivering the reticle from the reticle transporting system (not shown) onto the stage 213. At step A, the stage 213 is moved to a position where the reticle 201 is delivered; at step B, air is supplied to the retreating actuator 208 to thereby retreat the lever 203; at step C, the reticle 201 is transported onto the stage 213 by the reticle transporting system (not shown); at step D, the reticle 201 is aligned with the stage 213; at step E, the reticle 201 is held on the stage 213 by a holding unit (not shown); at step F, the retreating actuator 208 is evacuated and the lever 203 is abutted against the reticle 201; and at step G, the movement of the stage 213 is started.

Figure 5:
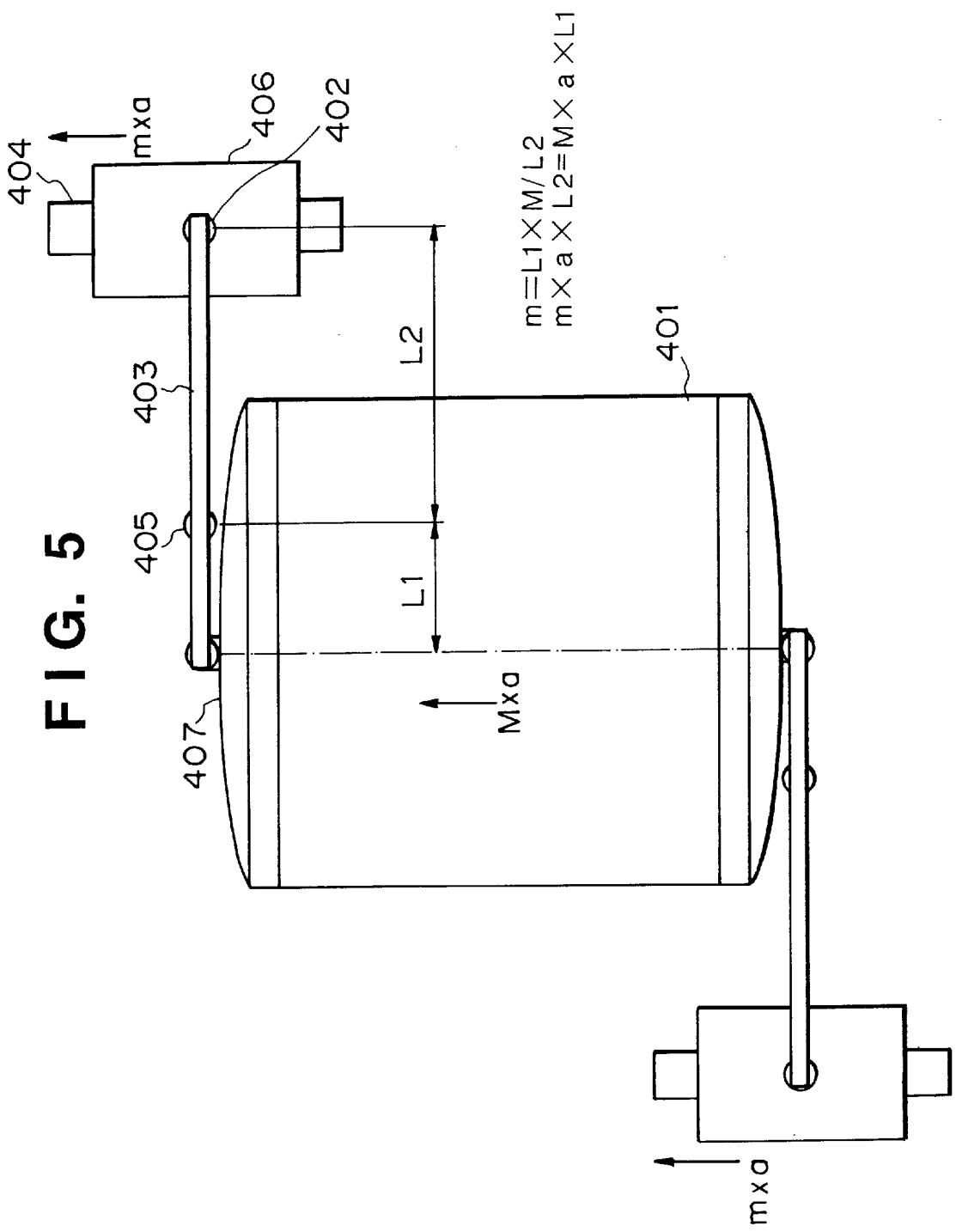
FIG. 5 is a view showing the arrangement of another example.

FIG. 5 is a view showing an example different from the above example. The example is composed of a single-axis guide 404 for a counter mass 406, a lever 403 for transmitting a force, a rotational hinge 402 for coupling the counter mass 406 with the lever 403 and a uniform pressure member 407. The force applied to a substrate 401 by the substrate 401 is dispersed to a side of the substrate.

A principle for canceling the force applied to the substrate 401 is the same as that described in FIG. 1. In the example, however, since the canceling force is applied on an end surface of the substrate 401 as the dispersed load, there can be obtained an operation/working-effect that the strain generated to the substrate 401 while the stage is accelerated or decelerated can be more reduced. With this operation, there also can be obtained effect that an accuracy can be improved when exposure is performed while the stage is accelerated or decelerated or when a mark drawn on the substrate 401 is measured for alignment.

Figure 6:
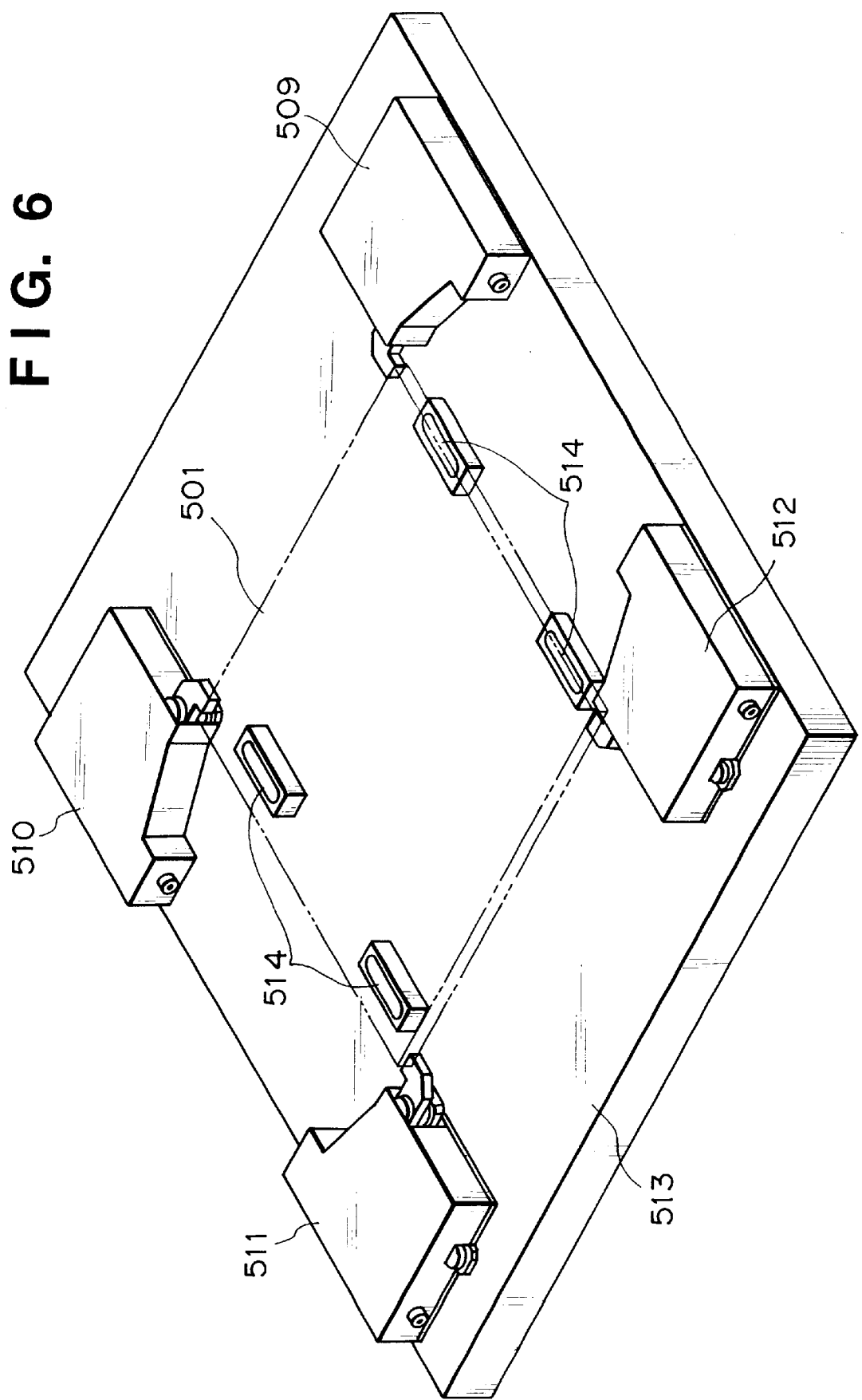
FIG. 6 is a perspective view showing the arrangement of another example.

FIG. 6 is a perspective view showing still another example. Four units 509, 510, 511, 512 are the same mechanisms as those shown in FIG. 3, respectively, and press the four corners of a reticle 501 with levers. The example has a feature that it is provided with vacuum adsorbing units 514 disposed on the stage 513 which is capable of holding the reticle 501, in addition to the above four units. Note, the example can be arranged using an electrostatic force, a magnetic force, an electromagnetic force, air pressure, hydraulic pressure, a mechanical force and the like, in addition to a vacuum adsorbing force.

When the force applied to the reticle 501 is canceled by the units 509, 510 or the units 511, 512, the mass of the counter masses can be reduced and accordingly the mass of the stage 513 also can be reduced because the vacuum adsorbing units 514 can be used together with the units. Further, the example is effective to prevent the actual displacement of the reticle 501 because a residual force which cannot be canceled by the counter mass due to various factors can be held by the vacuum adsorbing units 514.

Figure 7:
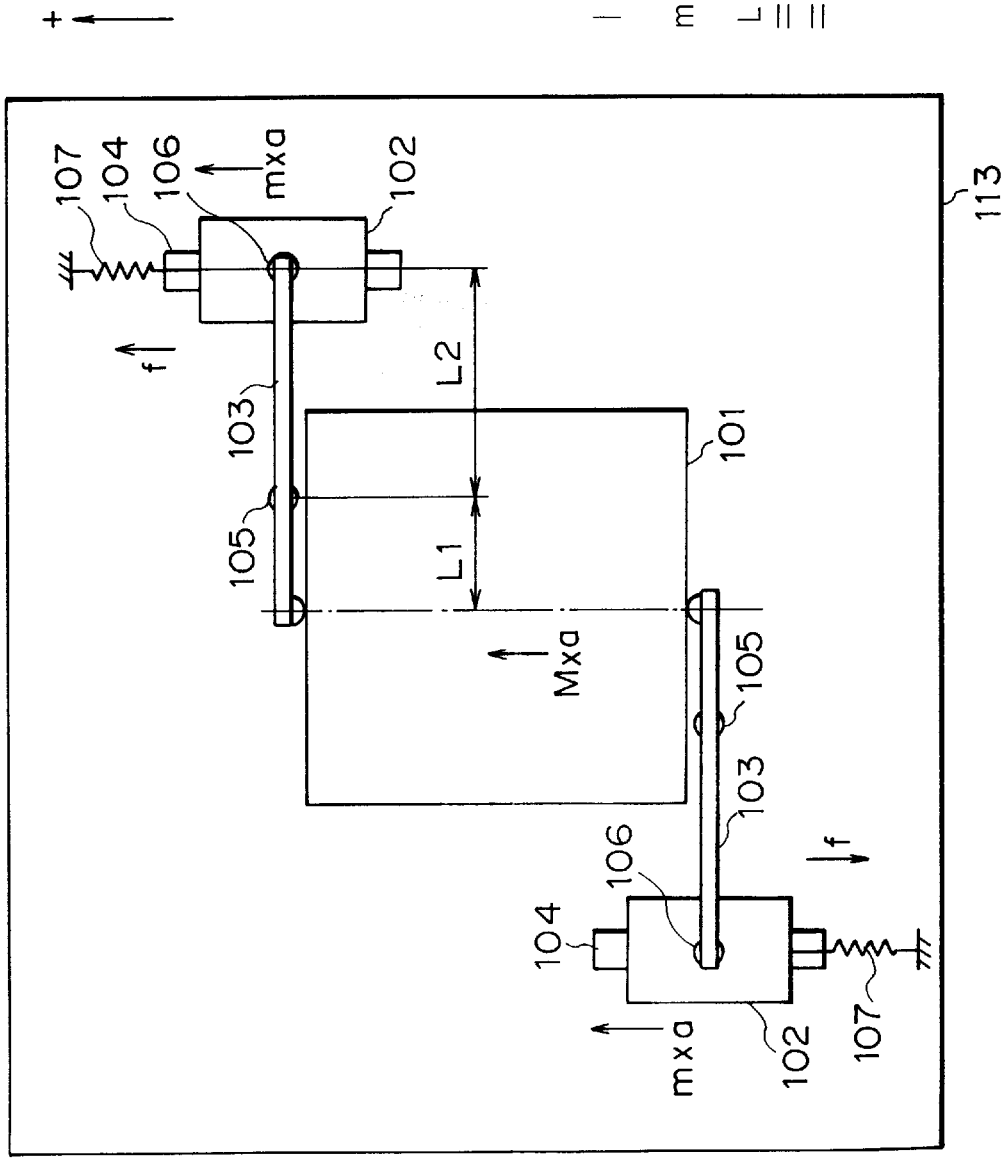
FIG. 7 is a view describing a modification of FIG. 1.
Figure 8:
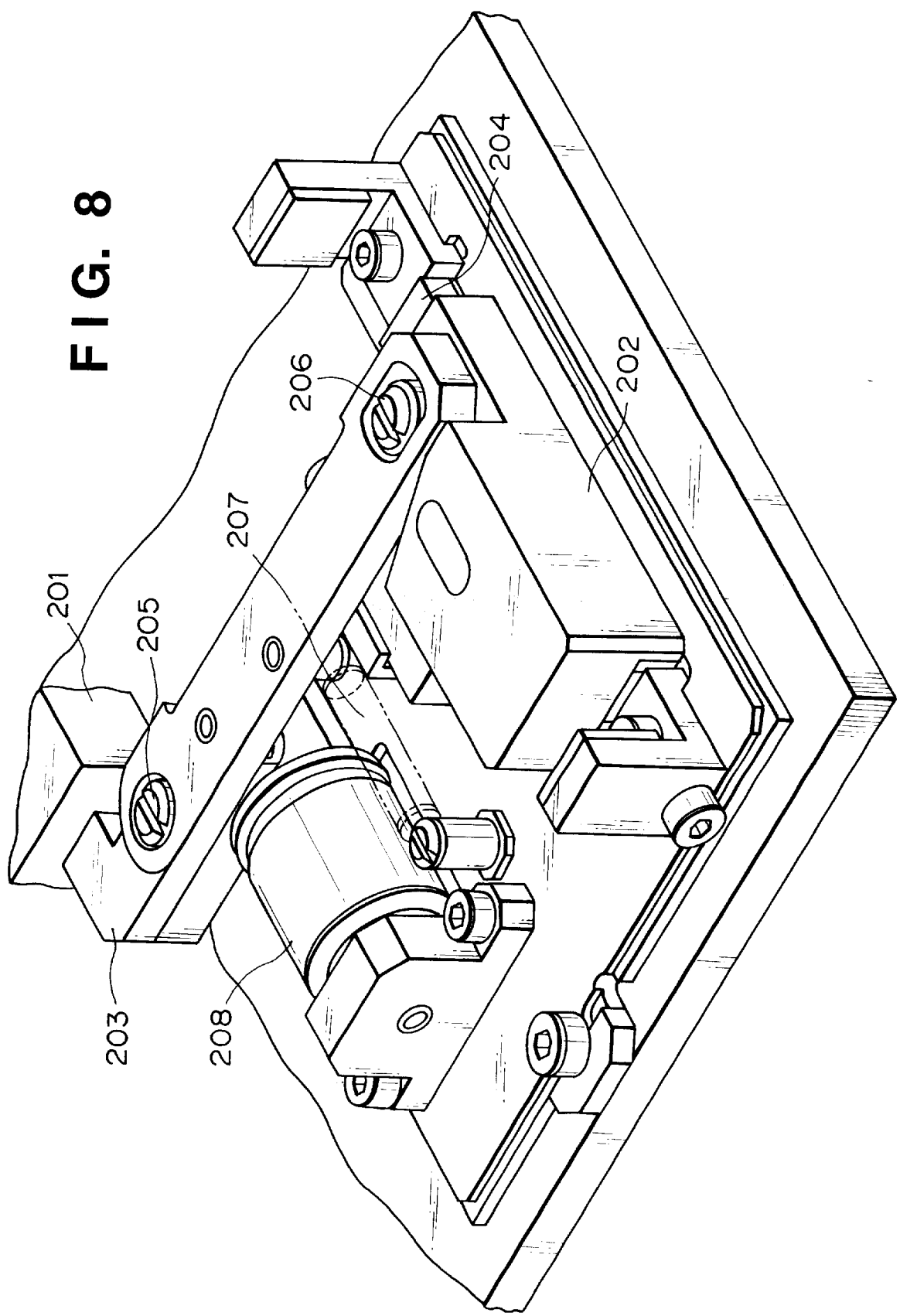
FIG. 8 is a view showing a modification of FIG. 3 in detail.

FIG. 7 is a view describing a modification of the example shown in FIG. 1; and FIG. 8 is a perspective view of a modification corresponding to the example shown in FIG. 2 and embodies the idea shown in FIG. 7. In the figures, the same numerals as used in the previous figures are used to denote the same members and the description of the members used repeatedly is omitted.

The modifications have a feature that pre-load springs 107 shown in FIG. 7 and a pre-load spring 207 shown in FIG. 8 are added to the previous examples. Since a pre-load spring 107 has an end connected to a counter mass 102 and the other end connected to a stage 113 and applies a pre-load f to the counter mass, a substrate 101 is always pressed by levers 103. Since the pre-load spring 107 is provided with each of the two units, the pre-load springs 107 press the substrate 101 from both sides thereof with respect to a scanning direction.

When the stage 113 is accelerated in a downward direction (hereinafter, referred to as a minus direction) at an acceleration a, a force +M×a acts on the substrate 101 (mass M) in an upward direction in the figure (hereinafter, referred to as a plus direction). At the same time, a force +m×a acts on the counter mass 102 (mass m) of the right unit in FIG. 7 in the upward direction in the figure (hereinafter, referred to as the plus direction) as well as a force +f is also applied thereto by the pre-load spring 107. The spring coefficient of the pre-load spring is set to satisfy the condition $|f| \geq |M \times A|$ (A: maximum acceleration). When the distance between the rotational hinge 105 and the rotational hinge 106 of each of levers 103 is represented by L2 and the distance between the rotational hinge 105 and the point of application of the substrate 101 is represented by L1, torque L2×(+f+M×a) is applied to the rotational hinge 106 in a counterclockwise direction about the rotational hinge 105.

On the other hand, since a force +m×a acts on the counter mass 102 of the left unit in FIG. 7 which is arranged in confrontation with the right unit and further a force -f is applied thereto by the pre-load spring 107, torque L2×(-f+m×a) is applied to the rotational hinge 106 in the counterclockwise about the rotational hinge 105.

Further, since a force +M×a acts on the substrate 101 while it is accelerated, torque L1×M×a is applied to the point where the upper lever 103 in FIG. 7 is in contact with the substrate 101 in a clockwise direction about the rotational hinge 105.

When the balance of forces on the center line of the substrate 101 is considered, the force in the minus direction (downward direction in the figure) is represented by the following formula 1.

$$-L2 \times (-f + m \times a) - L2 \times (f + m \times a) = -2 \times L2 \times m \times a \qquad \text{(formula 1)}$$

Whereas, the force in the plus direction is represented by the following formula 2.

$$+L1 \times M \times a \qquad \text{(formula 2)}$$

The relationship between the mass m of the counter mass 102 and the mass M of the substrate 101 is as shown in the following formula 3.

$$m = L1 \times M / (2 \times L2) \qquad \text{(formula 3)}$$

Accordingly, the force in the minus direction is represented by the following formula 4 by substituting the (formula 3) into the (formula 1).

$$-2 \times L2 \times m \times a = -L1 \times M \times a \qquad \text{(formula 4)}$$

Since the (formula 2) and the (formula 4) have the same value except that they have a different sign, both the values are canceled so that a force acting between the stage 113 and the substrate 101 can be made to zero regardless of the magnitude of the acceleration a. When the stage 113 moves in an opposite direction, an action arises in an opposite direction likewise to thereby cancel a force. As a result, the displacement of the substrate can be prevented when it is accelerated. This effect is remarkable as the acceleration increases and as the mass of the substrate increases. Note, it is sufficient for practical use to cancel and reduce the force applied to the substrate to such a degree as to permit a vacuum adsorbing force to hold the substrate against an acceleration even if a force for completely canceling the force applied to the substrate is not applied to the substrate by the counter masses 102.

Since the pre-loads are additionally applied to the substrate from both the sides thereof by the pre-load springs in a scanning direction so that the substrate is pressed in the embodiment, the levers 103 are not separated from the points where they are in contact with the substrate. In particular, the levers can keep contact with the substrate at the contact points by the relationship $|f| \geq |M \times A|$ even if the substrate is being accelerated. Therefore, a force can be canceled stably at all times.

Although the present invention has been described as to the examples applied to the reticle stage, the present invention may be also applied to a wafer stage likewise. In addition, it is needless to say that a mechanism such as a belt or the like may be used in place of the lever as a member for transmitting torque resulting from the moment of the counter masses.

Further, the present invention is also applicable to a vertical stage in which the plus direction in FIG. 1 faces a vertical direction. Since the self-weight of the reticle 101 is canceled by the counter masses 102 in this case, they also serve as a self-weight compensating mechanism.

<Scanning exposure apparatus>

Figure 9:
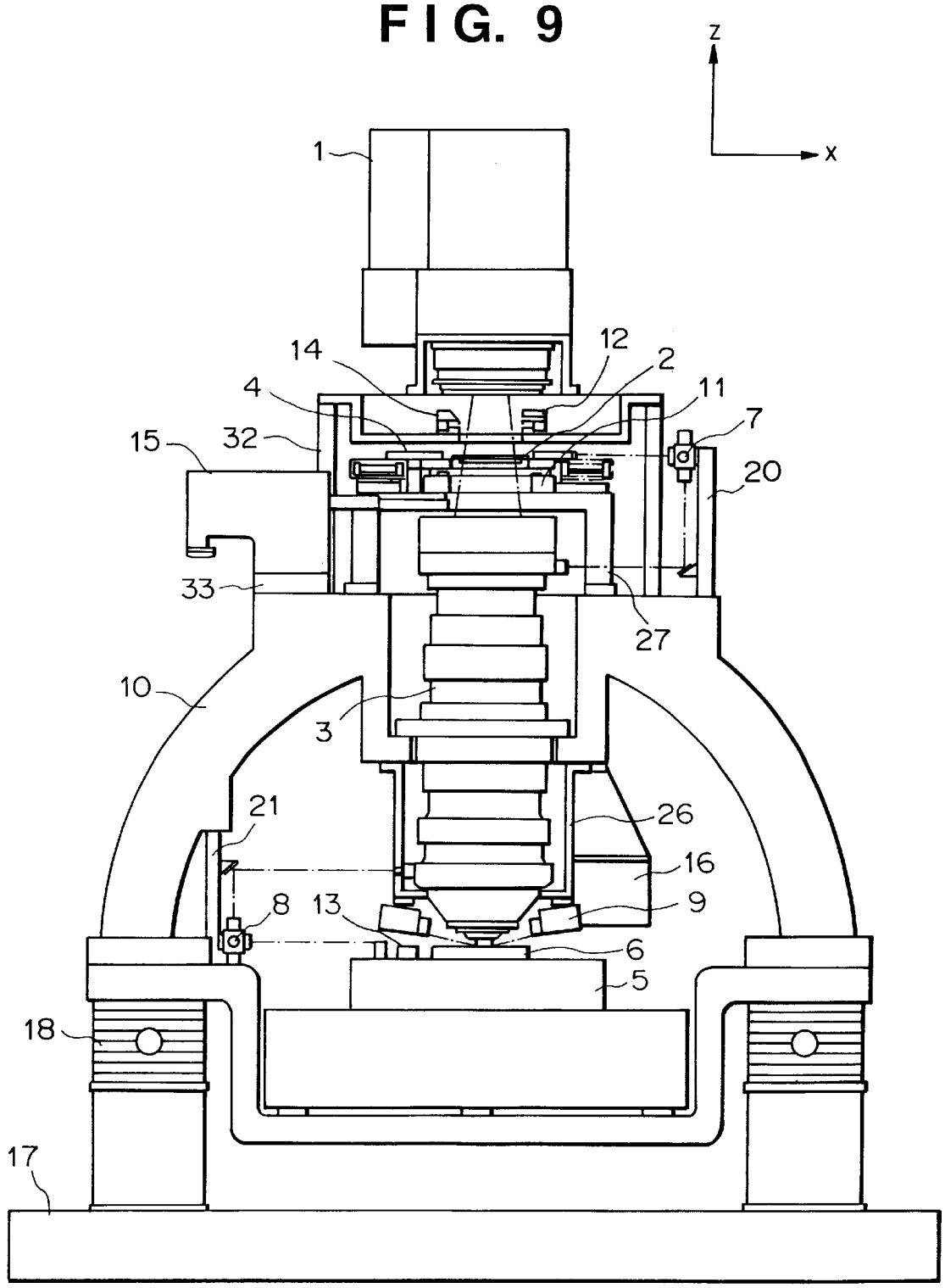
FIG. 9 is a side elevational view showing the overall arrangement of a scanning exposure apparatus.

FIG. 9 shows the arrangement of a scanning exposure apparatus having the stage apparatus described above as a reticle stage or a wafer stage. Here, the long distance direction of a slit is defined as an X-direction and the short distance direction thereof is defined as a Y-direction and scan exposure is performed in the Y-direction.

An illuminating system 1, a projecting optical system 3, alignment systems including 9, 12, 14, 15, 16 and stage systems including 4, 5, 7, 8, 19 are mechanically coupled with a lens barrel surface plate 10 through an exposing light TTR scope supporting section 32, a non-exposing light TTL scope supporting section 33, a focus sensor/off-axis scope supporting section 26, a reticle measuring interferometer supporting section 20, a wafer measuring interferometer supporting section 21, a reticle guide supporting section 27 and the like.

A pallet 17 for transporting the exposure apparatus is placed on a floor, oscillation removing mounts 18 are disposed on the pallet 17 to shut off the oscillation from the floor and the lens barrel surface plate is supported by the oscillation removing mounts 18. The oscillation removing mounts 18 accommodate a motor and correct the inclination of the lens barrel surface plate caused by the force generated by the movable sections of the stage systems.

The slit light emitted from the illuminating system 1 is irradiated onto a reticle 2 on which a fine pattern is formed. The pattern is transferred onto a wafer 6 to which a light sensitive agent is coated at the reducing magnification (for example, 4:1) of the projecting optical system 3 in the X-direction of the slit and at the reducing magnification ratio of the projecting optical system 3 in the Y-direction thereof while synchronizing the reticle stage 4 with the wafer stage 5.

The reticle 2 is held by the reticle stage 4 by a vacuum adsorbing force. Likewise, the wafer 6 is adsorbed to a substrate holding section on the wafer stage 5 by vacuum. One or both of the stages 4, 5 include a force canceling mechanism composed of the above counter mass. A stage is composed of a plane guide 11, the reticle stage 4 which can be positioned in X-, Y- and θ-axis directions and the wafer stage 5 which can be positioned in six-axis directions.

A measuring system for synchronizing the speed of the reticle with that of the wafer is composed of an X-, Y-interferometer (not shown), a θ-interferometer (not shown) and the wafer focus sensor 9. To describe the measuring system as to the synchronism in the X-direction, a difference causing a gap in synchronism is calculated from the values measured by the reticle X measuring interferometer 7 and the wafer X measuring interferometer 8 and scan exposure is performed while correcting the gap of synchronism using any one of the reticle stage 4 and the wafer stage 5 as a master or a slave. This is also applicable to the synchronism in the Y-direction and the θ-direction.

As to the Z-direction, that is, the tilt direction, the image surface of the wafer is measured with the wafer focus sensor 9 and corrected by the wafer stage 5, whereas the reticle is scan exposed using the reticle stage guide 11 as a criterion. All of the X-, Y-interferometer (not shown), the θ-interferometer (not shown) and the wafer focus sensor 9 which serve as a measurement criterion and the reticle guide 11 serving as a position reference are fixed to the lens barrel surface plate 10.

An alignment scope used to overlap elements between layers is mainly composed of four scopes and includes a reticle set scope 12 for detecting the displacement between the reticle 2 loaded from a not shown reticle transportation system and the reticle stage 4, an exposing light TTR scope 14 for detecting the displacement between the reticle 2 and a stage criterion mark placed on the wafer stage 5 through the projecting optical system 3, a non-exposing light TTL scope 15 for detecting the displacement between the alignment mark on the scribe line of an actual element on the wafer 6 and the criterion mark in the TTL scope using a He—Ne laser beam which is non-exposing light as alignment illuminating light through the projecting optical system 3 and an off-axis scope 16 for detecting the displacement between the alignment mark on the scribe line of an actual element of the wafer 6 and the criterion mark in the off-axis scope with white light which is non-exposing light as the alignment illuminating light without using the projecting optical system 3. The wafer is aligned with the reticle by aligning reticle alignment mark on the reticle 2 with the reticle reference mark on the lens barrel surface plate 10 using the reticle set scope 12.

On the other hand, the alignment mark on the scribe line of the actual element of the wafer 6 is attached on the lens barrel surface plate 10 and aligned with the criterion mark in the non-exposing light TTL scope 15 or the off-axis scope 16 using any one of them. The calibration of the reticle alignment mark on the reticle 2 and the in-scope criterion mark of the non-exposing light TTL scope 15 or the off-axis scope 16 is performed by the exposing light TTR scope 14 at each prescribed time.

More specifically, in an ordinary exposure sequence, the reticle 2 is indirectly aligned with the wafer 6 through marks separately disposed on the lens barrel surface plate 10. Further, wafer alignment is performed in such a manner that alignment is measured at several shots in a wafer, the measured values are statistically processed, a target value for each shot is calculated (global alignment) taking the shift of the wafer in the X- and Y-directions, the displacement thereof in the θ-direction and a magnification error into consideration, and synchronous scan exposure is performed when the wafer is exposed using a laser interferometer as a reference.

A scanning exposure apparatus of excellent capability capable of increasing the speed of a stage and the size of a substrate can be provided by disposing the aforesaid mechanism for canceling a force resulting from the acceleration or deceleration of a stage to a reticle stage or a wafer stage.

In particular, the reticle stage must be scanned at a speed higher than that of the wafer stage (four times higher than the speed of the wafer stage) in the scanning exposure apparatus and the acceleration of the reticle stage is larger than that of the wafer stage accordingly. Further, the center of gravity of the reticle stage is located at a position higher than that of the wafer stage. Therefore, a technical significance for providing the force canceling mechanism particularly with the reticle stage is remarkable and an excellent operation/working effect can be obtained thereby.

<Device manufacturing method>

Figure 10:
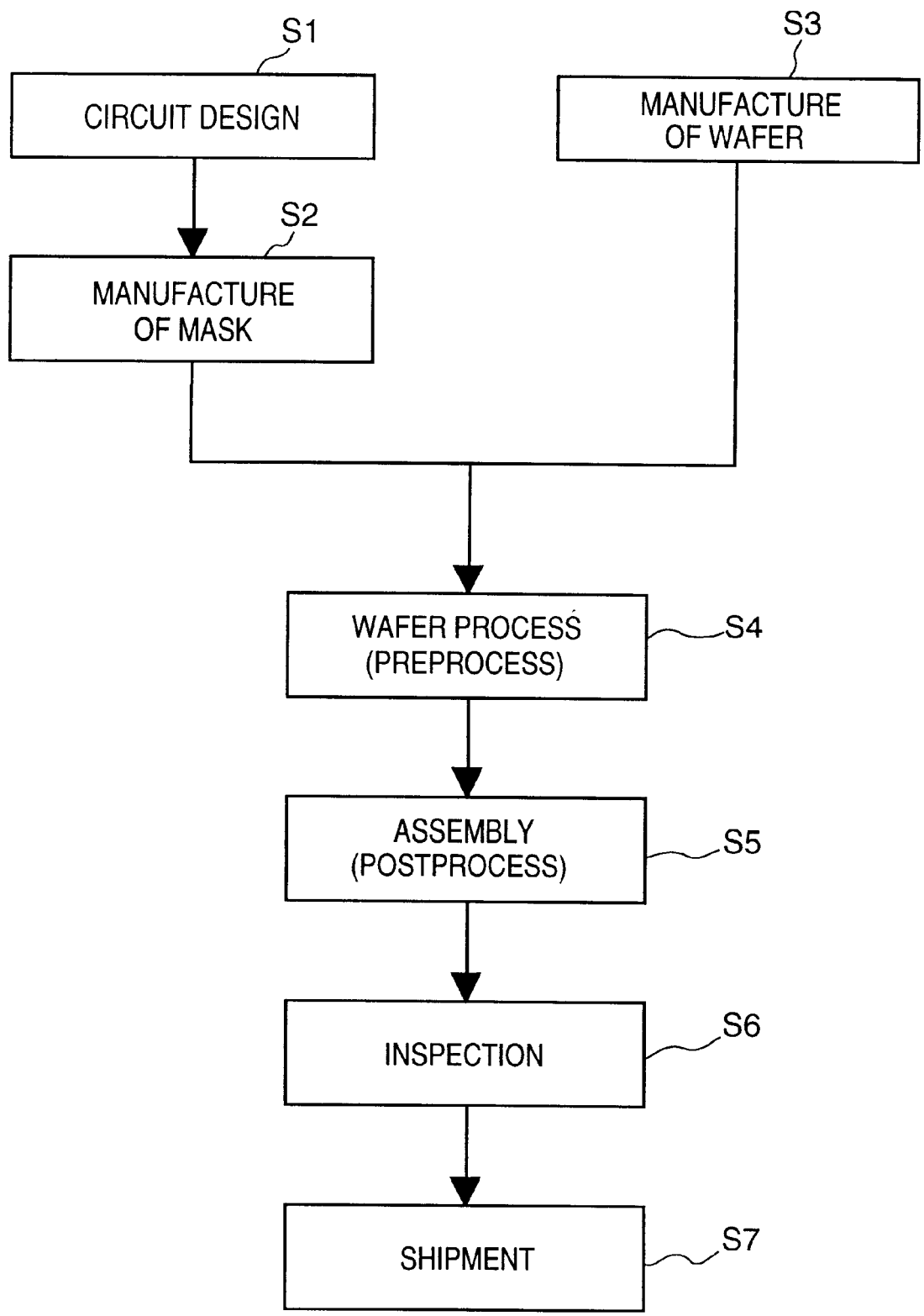
FIG. 10 is a flowchart showing a semiconductor device manufacturing method.

Next, an embodiment of a device manufacturing method making use of the exposure apparatus mentioned above will be described. FIG. 10 shows a flowchart for making a microdevice (e.g., a semiconductor chip such as an IC, an LSI, a liquid crystal panel, a CCD, a thin film magnetic head, a micromachine, etc). At step 1 (design of circuit), the pattern of a device is designed; at step 2 (mask manufacturing process), a mask on which the designed pattern is formed is made; at step 3 (wafer manufacturing process), a wafer is made using a material such as silicon, glass and the like; at step 4 (wafer process) which is called a preprocess, an actual circuit is formed on the wafer by lithography technology using the mask and the wafer prepared at the above steps; at step 5 (assembly process) which is called a postprocess and includes an assembly process (dicing, bonding), a packaging process (chip sealing process) and the like, a semiconductor chip is made from the wafer prepared at step 4; at step 6 (inspection process), an inspection such as a test for confirming the operation of the semiconductor device made at step 5, a test of the durability of the device and the like is carried out; and at step 7, the semiconductor devices having been completed through the above steps are shipped.

FIG. 11 shows the flowchart of the wafer process in detail. At step 11 (oxidation process), the surface of the wafer is oxidized; at step 12 (CVD process), an insulating film is formed on the surface of the wafer; at step 13 (electrode forming process); electrodes are formed on the wafer surface by vapor deposition; at step 14 (ion implanting process), ions are implanted into the wafer; at step 15 (resist process), a resist is coated on the wafer; at step 16 (exposing process), the circuit patterns of the mask are disposed to a plurality of shot regions of the wafer and printed and exposed thereto; at step 17 (developing process), the thus exposed wafer is developed; at step 18 (etching process), The portion other than the developed resist image is removed from the wafer, and at step 19 (resist removing process), an unnecessary resist is removed after etching is performed. Circuit patterns are superimposed on the wafer by the repetition of these steps.

According to the manufacturing method of the embodiment, a device of high accuracy, the manufacture of which has been difficult heretofore, can be made at a low cost.

As described above, according to the embodiments, since a force generated by the acceleration or deceleration of a stage can be canceled, a stage can be more accelerated (the speed of the stage can be increased) and a substrate size can be increased, whereby a scanning exposure apparatus having excellent capability can be provided.

In a scanning exposure apparatus arranged as a reduction projecting type, since an acceleration generated to a reticle stage is larger than that generated to a wafer stage as well as the center of gravity of the reticle stage is located at a position higher than that of the wafer stage, a remarkable effect can be obtained by the application of the present invention to the reticle stage.

Further, a device can be made using the exposure apparatus in higher productivity at a low cost.

What is claimed is:

1. A stage apparatus, comprising:
   a stage moving in a translational direction while holding a substrate; and
   a mechanism for applying a force on the substrate, by using a force applied to the substrate in accordance with an acceleration generated when the stage moves and the mass of the substrate, to cancel a force applied between the stage and the substrate by the acceleration.

2. A stage apparatus according to claim 1, wherein said stage is reciprocatingly movable along the translational direction and a plurality sets of said mechanism are disposed on both sides of the substrate with respect to the moving direction of said stage so that the plurality of sets apply a force to the substrate when the substrate moves both forward and backward.

3. A stage apparatus according to claim 2, wherein four sets of the mechanisms are disposed to thereby apply forces to four corners of the substrate.

4. A stage apparatus according to claim 1, wherein the substrate is held to said stage with a vacuum adsorbing force.

5. An exposure apparatus comprising:
   an illuminating optical system for illuminating a prescribed illuminating region of a reticle;
   a projecting optical system for projecting a pattern in the illuminating region on the reticle onto a wafer by reducing the size of the pattern;
   a reticle stage movable in a translational direction with respect to the illuminating region; and
   a wafer stage movable in a translational direction with respect to an exposing region which is conjugate with the illuminating region and performing scan exposure by moving the reticle stage and the wafer stage together with respect to the projecting optical system,
   wherein the stage apparatus according to claim 1 is used as the reticle stage.

6. A device manufacturing method, comprising manufacturing steps including a step for performing exposure using the exposure apparatus according to claim 5.

7. A stage apparatus, comprising:
   a stage moving in a translational direction while holding a substrate;
   a counter mass movable in the translational direction; and
   a mechanism for applying a force to the substrate, the force being, generated by the counter mass by using a force applied to the substrate in accordance with an acceleration generated when the stage moves and the mass of the substrate.

8. A stage apparatus according to claim 7, wherein said mechanism has a lever supported by a hinge mechanism, an end of said lever is connected to said counter mass, said lever imposes a force on a side of the substrate through the other end thereof to thereby apply a force for cancelling the force acting on the substrate as said stage is accelerated.

9. A stage apparatus according to claim 8, wherein a dispersed force is applied to a side of the substrate from the other end of the lever through a uniform pressure member.

10. A stage apparatus according to claim 7, further comprising means for applying a pre-load to both sides of the substrate with respect to the moving direction thereof not only when the substrate is accelerated but also when the substrate is not accelerated.

11. A stage apparatus according to claim 10, wherein said means for applying the pre-load has a spring connected to said counter mass.

12. A stage apparatus according to claim 10, wherein when the mass of the substrate is represented by M and the maximum acceleration of a moving body until the moving body is accelerated from a stationary state to a constant speed state or until the moving body is decelerated from the constant speed state to the stationary state is represented by A, the pre-load, which is referred to as f, satisfies the condition $|f| \geq |M \times A|$.

13. A stage apparatus, comprising:
   a stage moving in a translational direction while holding a substrate;
   a counter mass mounted on the stage; and
   a mechanism for canceling a force acting on the substrate in accordance with an acceleration generated when the stage moves and the mass of the substrate, by a force acting on the counter mass in accordance with the acceleration generated when the stage moves and the mass of the counter mass.

14. A stage apparatus according to claim 13, wherein said counter mass is movable in the translational direction on said stage.

15. A stage apparatus according to claim 13, further comprising a lever mounted on the stage, which guides the counter mass in the translational direction.

16. A stage apparatus according to claim 13, wherein said mechanism converts a force acting the counter mass into a force in an opposite direction of the translational direction.

17. A stage apparatus according to claim 13, wherein said mechanism has a lever for transmitting a force between the substrate and the counter mass and a rotational hinge for rotating and supporting the lever.

18. A stage apparatus according to claim 17, further comprising an actuator for retreating the lever.

19. A stage apparatus according to claim 13, wherein said stage has an adsorbing unit for adsorbing and holding the substrate.

20. A stage apparatus according to claim 19, wherein said adsorbing unit holds the substrate by vacuum adsorbing.

21. A stage apparatus according to claim 19, wherein said adsorbing unit holds the substrate using one of an electrostatic force, a magnetic force, an electromagnetic force, air pressure, hydraulic pressure, and a mechanical force.

22. A stage apparatus according to claim 13, further comprising a uniform pressure member, wherein a dispersed force is applied to a side of the substrate from the other end of the lever through said uniform pressure member.

23. A stage apparatus according to claim 13, wherein said stage is reciprocatingly movable along the translational direction and a plurality of sets of the mechanism is disposed on both sides of the substrate with respect to the moving direction of said stage so that the plurality of sets apply a force to the substrate when the substrate moves both forward and backward.

24. A stage apparatus according to claim 23, wherein four sets of the mechanism are disposed to thereby apply forces to four corners of the substrate.

25. A stage apparatus according to claim 13, further comprising means for applying a pre-load to both sides of the substrate with respect to the moving direction thereof not only when the substrate is accelerated but also when the substrate is not accelerated.

26. A stage apparatus according to claim 25, wherein said means for applying the pre-load has a spring connected to said counter mass.

27. A stage apparatus according to claim 26, wherein when the mass of the substrate is represented by M and the maximum acceleration of a moving body until the moving body is accelerated from a stationary state to a constant speed state or until the moving body is decelerated from the constant speed state to the stationary state is represented by A, the pre-load, which is referred to as f, satisfies the condition $|f| \geq |M \times A|$.

28. An exposure apparatus comprising:
   an illuminating optical system for illuminating a prescribed illuminating region of a reticle;
   a projecting optical system for projecting a pattern in the illuminating region on the reticle onto a wafer by reducing the size of the pattern;
   a reticle stage movable in a translational direction with respect to the illuminating region; and
   a wafer stage movable in a translational direction with respect to an exposing region which is conjugate with the illuminating region and performing scan exposure by moving said reticle stage and said wafer stage together with respect to said projecting optical system,
   wherein a stage apparatus, comprising (i) a stage moving in a translational direction while holding a substrate, (ii) a counter mass mounted on the stage and (iii) a mechanism for canceling a force acting on the substrate in accordance with an acceleration generated when the stage moves and the mass of the substrate, by a force acting on the counter mass in accordance with the acceleration generated when the stage moves and the mass of the counter mass, is used as the reticle stage.

29. A device manufacturing method comprising:
   performing exposure using an exposure apparatus comprising an illuminating optical system for illuminating a prescribed illuminating region of a reticle;
   projecting, using a projecting optical system, a pattern in the illumninating region on the reticle onto a wafer by reducing the size of the pattern;
   providing a reticle stage movable in a translational direction with respect to the illuminating region and a wafer stage movable in a translational direction with respect to an exposing region which is conjugate with the illuminating region and performing scan exposure by moving the reticle stage and the wafer stage together with respect to the projecting optical system; and
   using, as the reticle stage, a stage apparatus comprising (i) a stage moving in a translational direction while holding a substrate, (ii) a counter mass mounted on the stage and (iii) a mechanism for canceling a force acting on the substrate in accordance with an acceleration generated when the stage moves and the mass of the substrate, by a force acting on the counter mass accordance with the acceleration generated when the stage moves and the mass of the counter mass.

30. A method of moving a stage, said method comprising:
   moving a stage in a translational direction while holding a substrate; and
   applying, with a mechanism, a force on the substrate, by using a force applied to the substrate in accordance with an acceleration generated when the stage moves and the mass of the substrate, to cancel a force applied between the stage and the substrate by the acceleration.

31. A method aaccording to claim 30, further comprising reciprocatingly moving the stage along the translational direction and disposing a plurality of sets of the mechanism on both sides of the substrate with respect to the moving direction of the stage so that the plurality of sets apply a force to the substrate when the substrate moves both forward and backward.

32. A method according to claim 31, further comprising disposing four sets of the mechanisms to thereby apply forces to four corners of the substrate.

33. A method according to claim 30, further comprising holding the substrate to the stage with a vacuum adsorbing force.

34. A method of moving a stage, said method comprising:
   moving a stage in a translational direction while holding a substrate;
   providing a counter mass movable in the translational direction; and
   applying, with a mechanism, a force to the substrate, the force being generated by the counter mass by using a force applied to the substrate in accordance with an acceleration generated when the stage moves and the mass of the substrate.

35. A method according to claim 34, wherein the mechanism has a lever supported by a hinge mechanism, and an end of the lever is connected to the counter mass, and further comprising imposing, with the lever, a force on a side of the substrate through the other end thereof to thereby apply a force for cancelling the force acting on the substrate as the stage is accelerated.

36. A method according to claim 35, further comprising applying a dispersed force to a side of the substrate from the other end of the lever through a uniform pressure member.

37. A method according to claim 34, further comprising applying a pre-load to both sides of the substrate with respect to the moving direction thereof not only when the substrate is accelerated by also when the substrate is not accelerated.

38. A method according to claim 37, wherein the pre-load is applied by a spring connected to the counter mass.

39. A method according to claim 37, wherein when the mass of the substrate is represented by M and the maximum acceleration of a moving body until the moving body is accelerated from a stationary state to a constant speed state or until the moving body is decelerated from the constant speed state to the stationary state is represented by A, the pre-load, which is referred to as f, satisfies the condition $|f| \geq |M \times A|$.

40. An exposure method comprising:
    illuminating, with an illuminating optical system, a prescribed illuminating region of a reticle;
    projecting, with a projecting optical system, a pattern in the illuminating region on the reticle onto a wafer by reducing the size of the pattern;
    providing a reticle stage movable in a translational direction with respect to the illuminating region;
    providing a wafer stage movable in a translational direction with respect to an exposing region which is conjugate with the illuminating region;
    performing scan exposure by moving the reticle stage and the wafer stage together with respect to the projecting optical system; and
    applying, with a mechanism, a force on the substrate, by using a force applied to the substrate in accordance with an acceleration generated when the stage moves and the mass of the substrate, to cancel a force applied between the stage and the substrate by the acceleration.

41. A device manufacturing method, comprising manufacturing steps including steps for performing exposure using the exposure method according to claim 40.

42. A method of moving a stage, said method comprising:
    moving a stage in a translational direction while holding a substrate;
    mounting a counter mass on the stage; and
    canceling, with a mechanism, a force acting on the substrate in accordance with an acceleration generated when the stage moves and the mass of the substrate, by a force acting on the counter mass in accordance with the acceleration generated when the stage moves and the mass of the counter mass.

43. A method according to claim 42, wherein the counter mass is movable in the translational direction on the stage.

44. A method according to claim 42, further comprising mounting a lever on the stage, which guides the counter mass in the translational direction.

45. A method according to claim 42, wherein the mechanism converts a force acting on the counter mass into a force in an opposite direction of the translational direction.

46. A method according to claim 42, wherein the mechanism has a lever for transmitting a force between the substrate and the counter mass and a rotational hinge for rotating and supporting the lever.

47. A method according to claim 46, further comprising retreating the lever with an actuator.

48. A method according to claim 42, further comprising providing the stage with an adsorbing unit for adsorbing and holding the substrate.

49. A method apparatus according to claim 48, wherein the adsorbing unit holds the substrate by vacuum adsorbing.

50. A method according to claim 48, wherein the adsorbing unit holds the substrate using one of an electrostatic force, a magnetic force, an electromagnetic force, air pressure, hydraulic pressure, and mechanical force.

51. A method according to claim 42, further comprising providing a uniform pressure member, and applying a dispersed force to a side of the substrate from the other end of the lever through the uniform pressure member.

52. A method according to claim 42, further comprising reciprocatingly moving the stage along the translational direction and disposing a plurality of sets of the mechanism on both sides of the substrate with respect to the moving direction of the stage so that the plurality of sets apply a force to the substrate when the substrate moves both forward and backward.

53. A method according to claim 52, further comprising disposing four sets of the mechanism to thereby apply forces to four corners of the substrate.

54. A method according to claim 42, further comprising applying a pre-load to both sides of the substrate with respect to the moving direction thereof not only when the substrate is accelerated but also when the substrate is not accelerated.

55. A method according to claim 54, wherein the pre-load is applied by a spring connected to the counter mass.

56. A method according to claim 55, wherein when the mass of the substrate is represented by M and the maximum acceleration of a moving body until the moving body is accelerated from a stationary state to a constant speed state or until the moving body is decelerated from the constant speed state to the stationary state is represented by A, the pre-load, which is referred to as f, satisfies the condition $|f| \geq |M \times A|$.

57. An exposure method comprising:
    illuminating, with an illuminating optical system, a prescribed illuminating region of a reticle;
    projecting, with a projecting optical system, a pattern in the illuminating region on the reticle onto a wafer by reducing the size of the pattern;
    providing a reticle stage movable in a translational direction with respect to the illuminating region;
    providing a wafer stage movable in a translational direction with respect to an exposing region which is conjugate with the illuminating region and performing scna exposure by moving said reticle stage and said wafer stage together with respect to said projecting optical system;
    mounting a counter mass on the reticle stage; and
    providing a mechanism for canceling a force acting on the substrate in accordance with an acceleration generated when the stage moves and the mass of the substrate, by a force acting on the counter mass in accordance with the acceleration generated when the stage moves and the mass of the counter mass.

58. A stage apparatus comprising:
    a stage moving in a translational direction while holding a substrate;
    an adsorbing unit for adsorbing and holding the substrate;
    a counter mass mounted on the stage; and
    a mechanism for canceling a force acting on the substrate in accordance with an acceleration generated when the stage moves and the mass of the substrate, by a force acting on the counter mass in accordance with the acceleration generated when the stage moves, the mass of the counter mass and a force of adsorbing the substrate.

59. A stage apparatus according to claim 58, wherein said counter mass is movable in the translational direction on said stage.

60. A stage apparatus according to claim 58, further comprising a lever mounted on the stage, which guides the counter mass in the translational direction.

61. A stage apparatus according to claim 58, wherein said mechanism converts a force acting on the counter mass into a force in a direction opposite to the translational direction.

62. A stage apparatus according to claim 58, wherein said mechanism has a lever for transmitting a force between the substrate and the counter mass and a rotational hinge for rotating and supporting the lever.

63. A stage apparatus according to claim 62, further comprising an actuator for retreating the lever.

64. A stage apparatus according to claim 58, wherein the substrate is held to said stage with a vacuum adsorbing force.

65. A stage apparatus according to calim 58, wherein said adsorbing unit holds the substrate using one of an electrostatic force, a magnetic force, an electromagnetic force, air pressure, hydraulic pressure, and a mechanical force.

66. A stage apparatus according to claim 58, further comprising a uniform pressure member, wherein a dispersed force is applied to a side of the substrate from the other end of the lever through said uniform pressure member.

67. A stage apparatus according to claim 58, wherein said stage is reciprocatingly movable along the translational direction and a plurality of sets of the mechanism is disposed on both sides of the substrate with respect to the moving direction of said stage so that the plurality of sets apply a force to the substrate when the substrate moves both forward and backward.

68. A stage apparatus according to claim 67, wherein four sets of the mechanism are disposed to thereby apply force to four corners of the substrate.

69. A stage apparatus according to claim 58, further comprising means for applying a pre-load to both sides of the substrate with respect to the moving direction thereof not only when the substrate is accelerated but also when the substrate is not accelerated.

70. A stage apparatus according to claim 69, wherein the mass of the substrate is represented by M and the maximum acceleration of a moving body until the moving body is accelerated from a stationary state to a constant speed state or until the moving body is decelerated from the constant speed state to the stationary state is represented by A, the pre-load, which is referred to as f, satisfies the condition $|f| \geq |M \times A|$.

71. An exposure apparatus comprising:

an illuminating optical system for illuminating a prescribed illuminating region of a reticle;

a projecting optical system for projecting a pattern in the illuminating region on the reticle onto a wafer by reducing the size of the pattern;

a reticle stage movable in a translational direction with respect to the illuminating region; and a wafer stage movable in a translational direction with respect to an exposing region which is conjugate with the illuminating region and performing scan exposure by moving the reticle stage and the wafer stage together with respect to the projecting optical system, wherein a stage apparatus, comprising (i) a stage moving in a translational direction while holding a substrate; (ii) an adsorbing unit for adsorbing and holding the substrate; (iii) a counter mass mounted on the stage; and (iv) a mechanism for canceling a force acting on the substrate in accordance with an acceleration generated when the stage moves and the mass of the substrate, by a force acting on the counter mass in accordance with the acceleration generated when the stage moves, the mass of the counter mass and a force of adsorbing the substrate, is used as the reticle stage.

72. A device manufacturing method comprising:

performing exposure, using an exposure apparatus comprising an illuminating optical system, for illuminating a prescribed illuminating region of a reticle;

projecting, using a projecting optical system, a pattern in the illuminating region on the reticle onto a wafer by reducing the size of the pattern;

providing a reticle stage movable in a translational direction with respect to the illuminating region and a wafer stage movable in a translational direction with respect to an exposing region which is conjugate with the illuminating region and performing scan exposure by moving the reticle stage and the wafer stage together with respect to the projecting optical system; and using, as the reticle stage, a stage apparatus comprising (i) a stage moving in a translational direction while holding a substrate, (ii) a counter mass mounted on the stage, (iii) an adsorbing unit for adsorbing and holding the substrate and (iv) a mechanism for canceling a force acting on the substrate in accordance with an acceleration generated when the stage moves and the mass of the substrate, by a force acting on the counter mass in accordance with the acceleration generated when the stage moves, the mass of the counter mass and a force of adsorbing the substrate.

* * * * *

UNITED STATES PATENT AND TRADEMARK OFFICE
CERTIFICATE OF CORRECTION

PATENT NO. : 6,469,773 B1
DATED : October 22, 2002
INVENTOR(S) : Kazunori Iwamoto It is certified that error appears in the above-identified patent and that said Letters Patent is hereby corrected as shown below:

Column 1,
Line 18, "request." should read -- request, --.

Column 3,
Lines 38 and 42, "resect" should read -- respect --.

Column 4,
Line 51, the second occurrence of "substrate" should read -- uniform pressure member --.
Line 52, "401" should read -- 407 --.

Column 5,
Line 54, "force-f" should read --force -f --.

Column 6,
Line 19, "the" should be deleted.
Line 35, the first occurrence of "the" should be deleted.

Column 9,
Line 10, "The" should read -- the --.
Line 46, "plurality" should read -- plurality of --; and "mechanism are" should read -- mechanisms is --.

Column 10,
Line 13, "being," should read -- being --.

Line 41, "$|f \geqq |M \times A|.$" should read -- $|f \geq |M \times A|.$ --.

Line 60, "acting" should read -- acting on --.

Column 11,
Line 15, "mechanism" should read -- mechanisms --.

Line 37, "$|f \geqq |M \times A|.$" should read -- $|f \geq |M \times A|.$ --.

UNITED STATES PATENT AND TRADEMARK OFFICE
CERTIFICATE OF CORRECTION

PATENT NO. : 6,469,773 B1
DATED : October 22, 2002
INVENTOR(S) : Kazunori Iwamoto It is certified that error appears in the above-identified patent and that said Letters Patent is hereby corrected as shown below:

Column 12,
Line 14, "accor-" should read -- in accor- --.
Line 27, "mechanism" should read -- mechanisms --.

Column 13,

Line 6, " $|f \geqq| M \times A|$. " should read -- $|f \geq| M \times A|$. --.

Line 56, "apparatus" should be deleted.

Column 14,

Line 23, " $|f \geqq| M \times A|$. " should read -- $|f \geq| M \times A|$. --.

Line 34, "scna" should read -- scan --.

Column 15,
Line 20, "mechanism" should read -- mechanisms --.

Signed and Sealed this

Twenty-seventh Day of May, 2003

JAMES E. ROGAN
*Director of the United States Patent and Trademark Office*